(12) United States Patent
Farag

(10) Patent No.: US 7,764,743 B2
(45) Date of Patent: Jul. 27, 2010

(54) METHODS OF CHANNEL CODING FOR COMMUNICATION SYSTEMS

(75) Inventor: Emad N. Farag, Flanders, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 945 days.

(21) Appl. No.: 11/197,306

(22) Filed: Aug. 5, 2005

(65) Prior Publication Data

US 2007/0030917 A1 Feb. 8, 2007

(51) Int. Cl.
*H04L 5/12* (2006.01)

(52) U.S. Cl. ............... 375/265; 375/261; 375/260; 375/259; 704/242; 714/792; 370/328; 370/338; 370/208; 370/207

(58) Field of Classification Search .......... 375/265, 375/261, 260, 259; 704/242; 714/792; 370/328, 370/338, 208, 207
See application file for complete search history.

(56) References Cited

U.S. PATENT DOCUMENTS

| 2003/0133497 | A1* | 7/2003 | Kinjo et al. ............. 375/152 |
| 2004/0047321 | A1* | 3/2004 | Bui .......................... 370/338 |
| 2004/0187069 | A1* | 9/2004 | Pietraski et al. ......... 714/786 |
| 2004/0221222 | A1* | 11/2004 | Barry et al. ............... 714/790 |
| 2005/0053035 | A1 | 3/2005 | Kwak ........................ 370/331 |
| 2005/0100085 | A1* | 5/2005 | Dottling et al. ........... 375/240 |
| 2006/0039409 | A1* | 2/2006 | Lampinen ................. 370/474 |
| 2006/0171354 | A1* | 8/2006 | Tee et al. ................... 370/329 |
| 2007/0030917 | A1* | 2/2007 | Farag ........................ 375/265 |
| 2008/0192705 | A1* | 8/2008 | Suzuki ...................... 370/335 |

OTHER PUBLICATIONS

"Universal Mobile Telecommunications System (UMTS)" ETSI Standards, European Telecommunications Standards Institute, Sophia-Antipo, FR, vol. 3-R1, No. V650, Jun. 2005, XP014030540 ISSN: 0000-0001 cited in the application * section 4.5 *.
GB 2 388 751 A (Nippon Electric Co [JP]) Nov. 19, 2003 p. 3, line 5-p. 5, line 24; figure 2.
Semenov S: "Modified maximal ratio combining HARQ scheme for HSDPA" Personal, Indoor and Mobile Radio Communications, 2004. PIMRC 2004. 15th IEEE International Symposium on Barcelona, Spain Sep. 5-8, 2004, Piscataway, NJ, USA, IEEE, vol. 4, Sep. 5, 2004, pp. 2451-2453, XP010754326 ISBN: 0-7803-8523-3 * Section II *figure 1.

* cited by examiner

*Primary Examiner*—David C Payne
*Assistant Examiner*—Zewdu Kassa
(74) *Attorney, Agent, or Firm*—Harness, Dickey & Pierce

(57) ABSTRACT

A method of encoding data for transmission to one or more users selects a given number of bits of data from a transport block to be subject to hybrid ARQ functionality for channel coding. Only the selected bits are channel coded in a HARQ block for subsequent transmission using a given set of channelization codes to one or more users.

23 Claims, 3 Drawing Sheets

METHODS OF CHANNEL CODING FOR COMMUNICATION SYSTEMS

BACKGROUND OF THE INVENTION

1. Field of the Invention

The present invention relates generally to channel coding for wireless communication systems.

2. Description of the Related Art

Wideband Code Division Multiple Access (WCDMA), also known as Universal Mobile Telecommunication System (UMTS), is a technology for wideband digital radio communications of Internet, multimedia, video and other capacity-demanding applications. WCDMA uses a spectrum with a 5 MHz carrier, providing 50 times higher data rate than in present Global System for Mobile Communication (GSM) networks, and 10 times higher data rate than in General Packet Radio Service (GPRS) networks. WCDMA is one technology for 3G telecom systems, providing higher capacity for voice and data and higher data rates.

High Speed Downlink Packet Access (HSDPA) is a packet-based data service in the W-CDMA downlink with data transmission presently up to 8-10 Mbps (and presently up to 14.4 Mbps for MIMO systems) over a 5 MHz bandwidth in WCDMA downlink. HSDPA implementations include Adaptive Modulation and Coding (AMC), Hybrid Automatic Request (HARQ), and advanced receiver design.

HSDPA consists of a forward link data channel called a High-Speed Downlink Shared Channel (HS-DSCH). This is based on shard-channel transmission, which means that some channelization codes and the transmission power in a given cell are seen as a common resource, which is dynamically shared between users in the time and code domains. Shared channel transmission results in more efficient use of available codes and power resources.

Shared channel transmission results in more efficient use of available codes and power resources compared to the current use of a dedicated channel in WCDMA. The shared code resource onto which the HS-DSCH is mapped may consist of up to 15 codes. The actual number employed depends on the number of codes supported by the terminal/system, operator settings, desired system capacity, etc. The spreading factor (SF) is fixed at 16, and the sub-frame duration (Transmission Time Interval, TTI) is only 2 ms. The modulation schemes used are Quadrature Phase-Shift Keying (QPSK) and 16-QAM.

For HSDPA, fast link adaptation is done using adaptive modulation and coding based on the channel quality indicator (CQI) feedback, instead of power control as in WCDMA. The highest possible data-rate on a given link is ensured by link adaptation for both near users (high coding rate) and far users (low coding rate). While connected, an HSDPA user equipment (UE) periodically sends a CQI to the base station (BS) indicating the data-rate, coding and modulation scheme to be used, and the number of multi-codes the UE can support under its current radio conditions. The CQI also contains the information about the power level to be used.

Fast retransmission is done using Hybrid ARQ with incremental redundancy or chase combining. The retransmitted packets also use a different Gray coded constellation based on the bit reliabilities using the log likelihood ratio (LLR), in case of 16-QAM modulation. This modulation rearrangement improves the turbo decoding performance by averaging the bit reliabilities of QAM constellations with alphabet size greater than four. The UE also sends ACK/NACK for each packet such that the BS knows when to initiate retransmissions.

For HSPDA services, fast scheduling is done at the BS rather than at the radio network controller (RNC), as in WCDMA. This is done based on information on the channel quality, terminal capability, and quality of service (QoS) class and power/code availability. This channel-sensitive opportunistic scheduling obtains multi-user diversity gain by preferentially transmitting to users with better channel conditions.

In 3rd generation partnership project (3GPP) standards, Release 5 specifications focus on HSDPA to provide data rates up to approximately 10 Mbps to support packet-based multimedia services. MIMO systems are focused on in the Release 6 specifications and beyond, which are being developed to support even higher data transmission rates up to 14.4 Mbps. HSDPA is evolved from and backward compatible with Release 99 WCDMA systems.

Communication networks and systems adapted for HSPDA service are required to support transmission on up to fifteen (15) 16-Quadrature Amplitude Modulation (QAM) channelization codes to multiple users and/or to a single user. In a conventional example, each channel element (which may be understood herein as a given baseband processor capable of processing and transmitting digital bits of information over an air interface) is capable of supporting four (4) 16-QAM codes. Thus to support twelve (12) 16-QAM codes (for example), three (3) channel elements (CEs), e.g., baseband processors capable of processing and transmitting digital bits of information over an air interface should be used, with each CE transmitting four (4) 16-QAM codes.

Conventionally, to transmit data using all 12 QAM channelization codes to a single user, the channel encoding of a given Transmission Time Interval (TTI) of a HS-DSCH transport channel block, or "TTI block" occurs on a single CE, up to the physical channel segmentation, where after the data may be divided among multiple physical channels (PhCHs). After physical channel segmentation, the data may be sent to multiple CEs to transmit the data over the air using their corresponding 12 16-QAM transmitters.

There may be at least two potential drawbacks with the conventional approach. Firstly, channel encoding of the TTI block may lead to a longer latency, since most of the channel encoding occurs on a single CE, and then the data is typically transferred using a high-speed serial bus to multiple CEs. Secondly, use of a high-speed, inter-CE serial bus is required, which may add to system cost and complexity.

SUMMARY OF THE INVENTION

An example embodiment of the present invention is directed to a method of encoding data for transmission to one or more users. In the example method, a given number of bits of data from a transport block may be selected to be passed to hybrid ARQ functionality for channel coding, and the selected bits may be channel coded in a HARQ block for transmission using a given set of channelization codes to one or more users.

Another example embodiment of the present invention is directed to a method of distributing channel coding for a transport block received by a plurality of channel elements for transmission to one or more users. The method may include separating, at each given channel element, the transport block that has been coded into systematic bits, parity one bits and parity two bits. A given, lesser number of the systematic, parity one and parity two bits may be selected for hybrid ARQ processing to channel encode the bits for subsequent transmission by the given channel element to one or more users.

Another example embodiment of the present invention is directed to a method of determining bits of data to be passed to a rate-matching function in a channel element for encoding the bits prior to transmission by the channel element to one or more users. The method may include separating a transport block received by the channel element into a total set of systematic bits, parity one bits and parity two bits. A given number of the systematic, parity one and parity two bits less than the total set may be selected so as to be subject to the rate-matching function in a HARQ block of the channel element for channel coding. Only the selected bits are input to the HARQ block for transmission using a given set of channelization codes to one or more users.

Another example embodiment of the present invention is directed to a method of determining which bits of a received transport bock to pass through a rate-matching function implemented in a channel element to channel code the bits for transmission by the channel element. The method includes determining bits that are to be input, and not punctured, to a first rate-matching stage of a two-stage rate matching function based on a set of bits that are to be output of the second rate matching stage.

Another example embodiment of the present invention is directed to a method of determining which bits of a received transport block to pass to a rate-matching function and not to puncture, so as to channel code the bits for transmission by a channel element. The method may include determining bits that are to be input to a first rate-matching stage of an N-stage (N>2) rate matching function implemented in a HARQ block of the channel element based on the output bits from a subsequent rate-matching stage.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

DETAILED DESCRIPTION OF THE EXAMPLE EMBODIMENTS

Although the following description relates to a communication network or system based on one or more of CDMA (IS95, cdma2000 and various technology variations), WCDMA/UMTS, and/or related technologies, and will be described in this example context, it should be noted that the example embodiments shown and described herein are meant to be illustrative only and not limiting in any way. As such, various modifications will be apparent to those skilled in the art for application to communication systems or networks based on technologies other than the above, which may be in various stages of development and intended for future replacement of, or use with, the above networks or systems.

As used herein, the term user may be synonymous to a mobile station, mobile user, user equipment (UE), user, subscriber, wireless terminal and/or remote station and may describe a remote user of wireless resources in a wireless communication network. The term 'cell' may be understood as a base station (also known as a Node B), access point, and/or any terminus of radio frequency communication. A channel element may be understood as a baseband processor capable of processing and transmitting digital bits of information over an air interface.

In general, example embodiments of the present invention are directed to a method of encoding data for transmission to one or more users, and/or a method of distributing channel coding for a transport block among multiple channel elements for transmission to one or more users, and/or a method of determining bits of data to be subject to HARQ encoding in a given channel element for transmission to one or more users. Each example methodology may support transmitting data using up to at least 12 16-QAM codes to a single user or to multiple users. The example methodologies described hereafter do not require use of a high-speed serial bus, and may achieve a lower latency as compared to conventional channel coding methodologies.

In an aspect of the invention the example methodology may be extended to enable transmission of data using up to 15 16-QAM codes. In such a case, four CEs may be used for the transmission of the HS-DSCH channel, where 3 of the CEs may each be configured to transmit using 4 channelization codes, with the fourth CE transmitting data using 3 channelization codes.

Figure 1:
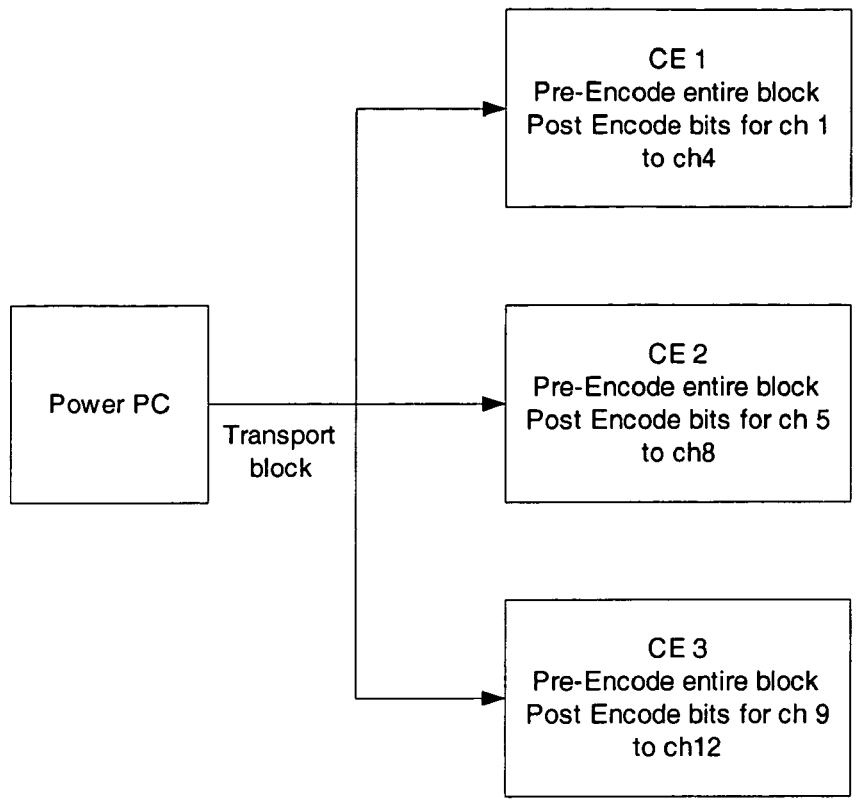
FIG. 1 is a block diagram illustrating the flow of input data from a base station scheduler to a plurality of channel elements, for describing a method of channel coding in accordance with an example embodiment of the present invention.

FIG. 1 is a block diagram illustrating the flow of input data from a base station scheduler to a plurality of channel elements, for describing a method of channel coding in accordance with an example embodiment of the present invention. In the example as shown in FIG. 1, three channel elements (CEs) may be allocated to the HS-DSCH. Each CE may transmit data using four (4) 16-QAM transmitters. For this example, the scheduler at the Node-B is set to transmit a single HS-DSCH transport block ("block") to a single user using twelve (12) 16-QAM codes.

In FIG. 1, there is shown a Power PC, which is a processor in the Node B responsible for generating the HS-DSCH transport blocks to all the CEs. For the received transport block, each CE may compute the cyclic redundancy check (CRC) attachment, perform bit scrambling and Turbo encoding (as well as code block segmentation and code block concatenation) for the entire block. The implementation for performing CRC attachment, bit scrambling, Turbo encoding, code block segmentation and concatenation is known and described in the 3GPP standard, as specified in Section 4.5, entitled "Coding for HS-DSCH", with reference to various sections in Section 4.2, "General coding and Multiplexing of TrChs", within the 3GPP Technical Specification UMTS Channel Coding and Multiplexing (FDD), 3GPP TS 25.212 version 6.4.0 Release 6 (2005-03). Therefore, a detailed description of these known processes is omitted for purposes of brevity.

However, as will be seen in further detail below with regard to the example embodiments, and beginning with the HARQ processing functionality ("HARQ block") for the input bits of the block received from the Turbo encoder, only the bits that are to be transmitted by each given CE will be encoded. In the example methodology as to be detailed hereafter, the number of systematic bits, parity one bits and parity two bits at the input of the HARQ block which are to fill given columns in a bit collection matrix of the HARQ block may be determined in advance of actually being subject to the HARQ processing in the HARQ block. It is these bits that will be transmitted using the 16-QAM channelization codes. Thus, only these bits will be required to pass through the HARQ block. The remaining bits from the Turbo encoder are ignored by this channel element.

Most of the million instructions per second (MIPS) usage occurs in the HARQ function as well as the following functions, such as physical channel segmentation, HS-DSCH interleaving, constellation re-arrangement for 16 QAM and physical channel mapping, as specified in Section 4.5 of 3GPP TS 25.212 version 6.4.0 Release 6. Additionally, the Turbo encoding may be performed using an ASIC accelerator, so the encoding does not consume any MIPS on the processor that performs channel coding. This is relevant because it allows the Power PC to send the complete block to each channel element, the pre-HARQ functions are either done in an ASIC accelerator or consume little MIPS For example, if the data is 2 Mbps, the channel coding functions prior to HARQ consume less than a combined 8 MIPS (this includes writing data to an ASIC encoder and reading data from the ASIC encoder). The channel coding functions after and including HARQ consume about 164 MIPS. This is about 20 times more than the MIPS consumed by the channel coding functions pre-HARQ. Therefore, by performing channel encoding for the entire block before the HARQ block, the increase in MIPS may be relatively small, as compared with the MIPS used in the HARQ and the following channel coding functions.

Distributing HARQ Encoding Among Multiple CEs

Figure 2:
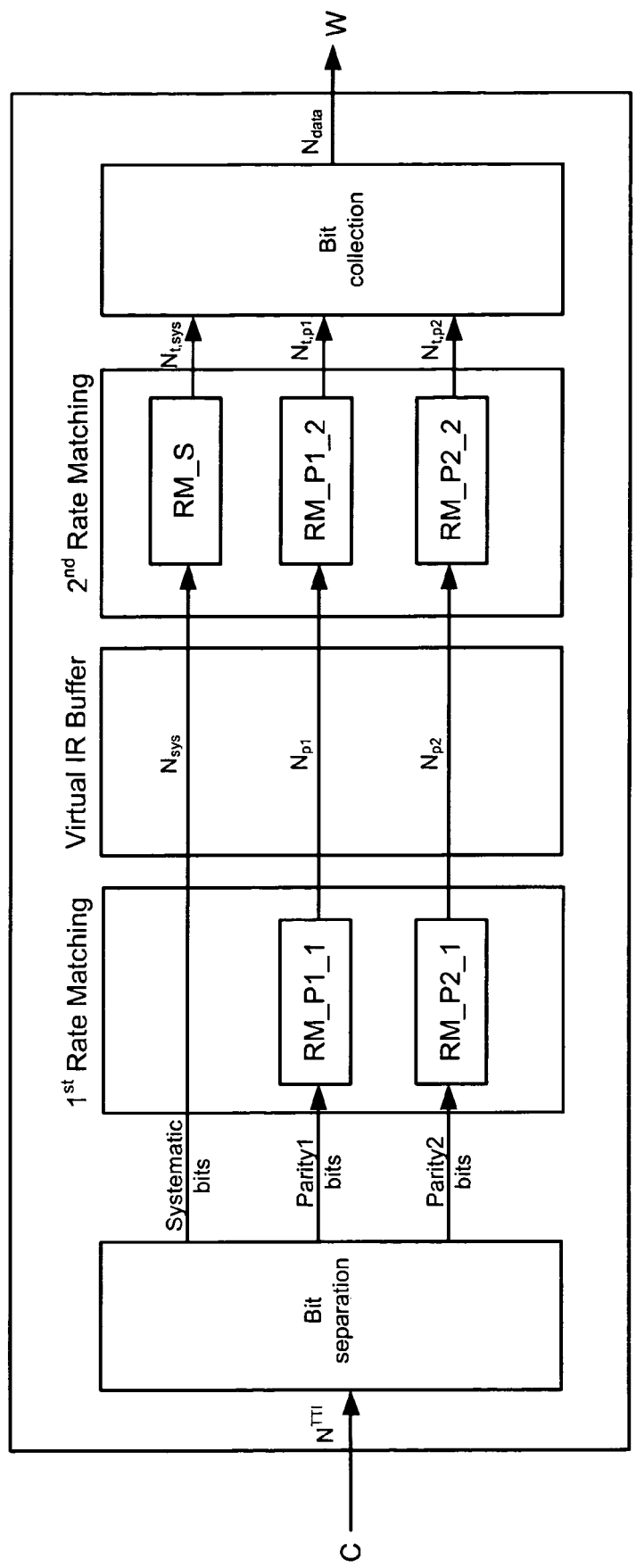
FIG. 2 is a block diagram illustrating HS-DSCH hybrid ARQ functionality.

FIG. 2 is a block diagram illustrating HS-DSCH hybrid ARQ functionality. FIG. 2 is illustrated in section 4.5.4 of TS 25.212, and is provided for context. In general, the hybrid ARQ functionality, also referred to as a "HARQ block" as shown in FIG. 2, matches the number of bits at the output of the channel coder (Turbo encoder), shown in FIG. 2 as "$N^{TTI}$" to the total number of bits of the High Speed Physical Downlink Shared Channel (HS-PDSCH) set to which the HS-DSCH is mapped, shown generically as "$N_{data}$" in FIG. 2. The hybrid ARQ functionality may be controlled by redundancy version (RV) parameters, which are used to compute rate-matching parameters $e_{minus}$, $e_{plus}$ and $e_{ini}$.

The hybrid ARQ functionality consists of two rate-matching stages and a virtual buffer as shown in FIG. 2. In general, the first rate-matching stage matches the number of input bits to the virtual IR buffer, information about which is provided by higher layers. The first rate-matching stage is transparent if the number of input bits (shown as $N^{TTI}$) does not exceed the virtual IR buffering capability. The second rate-matching stage matches the number of bits after the first rate-matching stage to the number of physical channel bits available in the HS-PDSCH set in the TTI.

For purposes of describing the example methodology, the input data to the HARQ block from the Turbo encoder can be represented by $C_1, C_2, \ldots C_N$, where N is the total number of bits at the input to the HARQ block. In an example, N may be a multiple of three.

As shown in FIG. 2, a HARQ bit separation function splits the input data into three streams: systematic bits, parity one bits and parity two bits. These bits are subject to first and second stages of rate matching and finally to a bit collection function. Table 1 defines the parameters used in equations for describing the example methodologies in accordance with the invention. Frequent reference should be made to Table 1 for the following discussion.

TABLE 1

Parameter Definitions

| | |
|---|---|
| $N_{sys, in}$ | denotes the number of systematic bits at the input of the HARQ block. |
| $N_{p1, in}$ | denotes the number of parity one bits at the input of the HARQ block. |
| $N_{p2, in}$ | denotes the number of parity two bits at the input of the HARQ block. |
| $N_{sys}$ | denotes the number of systematic bits at the output of the first stage of rate matching, and is always equal to $N_{sys, in}$. |
| $N_{p1}$ | denotes the number of parity one bits at the output of the first stage of rate matching. |
| $N_{p2}$ | denotes the number of parity two bits at the output of the first stage of rate matching. |
| $N_{t, sys}$ | denotes the number of systematic bits at the output of the second stage of rate matching. |
| $N_{t, p1}$ | denotes the number of parity one bits at the output of the second stage of rate matching. |
| $N_{t, p2}$ | denotes the number of parity two bits at the output of the second stage of rate matching. |
| $e_{ini, sys\_2}$, $e_{minus, sys\_2}$, $e_{plus, sys\_2}$ | represent the rate matching parameters for the systematic bits in the second stage of rate matching. |
| $e_{ini, p1\_1}$, $e_{minus, p1\_1}$, $e_{plus, p1\_1}$ | represent the rate matching parameters for the parity one bits in the first stage of rate matching. |
| $e_{ini, p2\_1}$, $e_{minus, p2\_1}$, $e_{plus, p2\_1}$ | represent the rate matching parameters for the parity two bits in the first stage of rate matching. |
| $e_{ini, p1\_2}$, $e_{minus, p1\_2}$, $e_{plus, p1\_2}$ | represent the rate matching parameters for the parity one bits in the second stage of rate matching. |
| $e_{ini, p2\_2}$, $e_{minus, p2\_2}$, $e_{plus, p2\_2}$ | represent the rate matching parameters for the parity two bits in the second stage of rate matching. |

The HARQ bit collection is achieved by writing the data to a rectangular matrix with the following dimensions as indicated by the equations of expression (1):

$$N_{row} \times N_{col}$$

Where:

$$N_{row} = \begin{cases} 2 & \text{for } QPSK \\ 4 & \text{for } 16-QAM \end{cases} \quad (1)$$

$$N_{col} = 480 \times (\text{Number of Channelization Codes}).$$

Thus in expression (1), $N_{row}$ is the number of rows in the bit collection matrix of FIG. 2, $N_{col}$ denotes the number of columns in the bit collection matrix. The systematic bits fill all the columns of the first $N_r$ rows and the first $N_c$ columns of row $N_r+1$. The parity bits (parity one and/or parity two) fill the remaining columns of this row and all the columns of the remaining rows. The filling in of the rows and columns is described in detail in the 3GPP standard document TS25.212, thus a detailed description herein is omitted for purposes of brevity.

Without loss of generality, and as an example, the channelization codes may be numbered sequentially starting from channelization code 0. In this example, a given channel element (CE) is to transmit channelization codes $ch_s$ (s=starting code) to $ch_e$ (e=ending code) inclusive. Accordingly, the bits starting from column $N_{col,s}=480\times ch_s+1$ of the HARQ bit collection matrix, to column $N_{col,e}=480\times(ch_e+1)$ of the HARQ bit collection matrix may be transmitted by this channel element.

Thus, the HARQ function should only output these bits, with an inverse transformation performed in order to determine which input bits (at the input of the HARQ block) will give the desired bits at the output of the HARQ block. The HARQ functionality will thus only execute for these bits. In other words, the example methodology is configured to determine which bits, from the total set or amount of systematic bits, parity one bits and/or parity two bits that are input from the Turbo encoder, that are to be subject to the HARQ functionality in the HARQ block, so as to channel encode (HARQ encode) the bits for eventual transmission from the given CE to one or more users.

Determining the Systematic Bits to be Subject to the HARQ Functionality

In this example, the systematic bits at the output of second stage of rate-matching may be denoted as $S1_1, S2_2, \ldots, S2_{N_{t,s}}$. The bit $$S2_{Nt,sys\_s}$$

may denote the first systematic bit in column $N_{col,s}$, and the bit $$S2_{Nt,sys\_e}$$

may denote the last systematic bit in column $N_{col,e}$. Accordingly, the bit $N_{t,s\_s}$ is the 'first' or 'starting' systematic bit at the output of the second stage of rate matching (stage 2) that will be transmitted by this CE, and may be given by expression (2):

$$N_{t,sys\_s} = \begin{cases} (N_r+1)(N_{col,s}-1)+1 & N_c \geq N_{col,s} \\ (N_r+1)N_c + N_r(N_{col,s}-N_c-1)+1 & \text{otherwise} \end{cases} \quad (2)$$

$N_{t,s\_e}$ is the 'last' or 'ending' systematic bit at the output of the second stage of rate matching that will be transmitted by this CE, and may be given by expression (3) below.

$$N_{t,sys\_s} = \begin{cases} (N_r+1)N_{col,s} & N_c \geq N_{col,e} \\ (N_r+1)N_c + N_r(N_{col,e}-N_c) & \text{otherwise} \end{cases} \quad (3)$$

If $N_{t,s\_s}$ is larger than $N_{t,s\_e}$ no systematic bits are transmitted by this CE. Accordingly, a first step in determining the systematic bits that are to be subject to the HARQ functionality is a type of thresholding evaluation in which $N_{t,s\_s}$ and $N_{t,s\_e}$ at the output of the second stage of rate matching are determined from known parameters, and the two bit values are compared to determine whether any systematic bits will be transmitted by the given CE.

Additionally in this example, the systematic bits at the output of first stage of rate matching are $S1_1, S1_2, \ldots, S1_{N_{sys}}$, where $S1_{N_{sys}\_s}$ denotes the systematic bit at the output of the first stage of rate matching that gives systematic bit $S1_{N_{t,s}\_s}$ at the output of the second stage of rate matching. It can be shown that, in the case of puncturing, $N_{sys\_s}$, which is the 'first' or 'starting' systematic bit at the output of the first stage of rate matching, that will be processed by this CE may be described by expression (4):

$$N_{sys\_s} = \left\lfloor \frac{N_{t,sys\_s} \cdot e_{plus,sys\_2} - e_{ini,sys\_2}}{e_{plus,sys\_2} - e_{minus,sys\_2}} \right\rfloor + 1. \quad (4)$$

Expression (4) thus illustrates that the first systematic bit at the output of stage 1 (to be processed by the CE) may be determined as a function of the first systematic bit at the output of the second stage of rate matching to be transmitted by the given CE, and the rate matching parameters for the systematic bits in stage 2.

Puncturing occurs when the number of bits at the output of the second rate matching stage (stage 2) is less than the number of bits at the input to stage 2 of the rate matching function. In this case, some bits are thrown away (punctured or discarded). Repetition, on the other hand, occurs when the number of bits at the output of the rate matching function is more than the number of bits at the input to the rate matching function. In this case, some of the input bits are repeated.

In expression (4) and following expressions, the rate-matching state parameters $e_{minus,s\_2}$ and $e_{plus,s\_2}$ are the same across all CEs (as is $e_{minus,p1\_1}$, $e_{minus,p1\_2}$, $e_{minus,p2\_1}$, $e_{minus,p2\_2}$, $e_{plus,p1\_1}$, $e_{plus,p1\_2}$, $e_{plus,p2\_1}$ and $e_{plus,p2\_2}$ for the rate matching of the parity 1 and parity 2 bits). The rate matching state variable $e_{ini}$ in expression (4) is the state variable for the first bit that will be processed by this CE. Unlike the rate matching state parameters, which are the same across all CEs, the value of $e_{ini}$ may differ from CE to CE. The value of the rate-matching state variable $e_{ini}$ at $N_{sys\_s}$ may be expressed by expression (5):

$$e_{ini}(N_{sys\_s}) = e_{ini,s\_2} - (N_{t,s\_s}-1)e_{plus,s\_2} + (N_{sys\_s}-1)(e_{plus,s\_2} - e_{minus,s\_2}). \quad (5)$$

Expression (5) thus shows that, for puncturing, the state variable for the first bit that will be processed by this CE may be determined as a function of the rate matching state variable for stage 2 rate matching ($e_{ini,s\_2}$), the stage 2 rate matching parameters $e_{minus,s\_2}$ and $e_{plus,s\_2}$, the first systematic bit at the output of stage 1 to be processed by the CE ($N_{sys\_s}$) and the first systematic bit at the output of stage 2 rate matching to be transmitted by the given CE ($N_{t,s\_s}$).

Expression (6) describes $N_{sys\_s}$ for the case of repetition:

$$N_{sys\_s} = \left\lceil \frac{(N_{t,sys\_s}-1)e_{plus,sys\_2} + e_{ini,sys\_2}}{e_{plus,sys\_2} + e_{minus,sys\_2}} \right\rceil. \quad (6)$$

The value of the rate matching state variable $e_{ini}$, at $N_{sys\_s}$ in the case of repetition may be given by expression (7):

$$e_{ini}(N_{sys\_s}) = e_{ini,s\_2} - (N_{t,s\_s}-1)e_{plus,s\_2} - (N_{sys\_s}-1)(e_{plus,s\_2} + e_{minus,s\_2}) \quad (7)$$

As discussed above, $S1_{N_{sys}\_e}$ denotes the systematic bit at the output of the first stage of rate matching that gives the systematic bit $S1_{N_{t,s}\_e}$ at the output of the second stage of rate matching. Expression (8) can thus show that, in the case of puncturing, $N_{sys\_e}$, the 'last' or 'ending' systematic bit at the output of the first stage of rate matching which is processed by this CE, may be given by:

$$N_{sys\_e} = \left\lfloor \frac{N_{t,sys\_e} \cdot e_{plus,sys\_2} - e_{ini,sys\_2}}{e_{plus,sys\_2} - e_{minus,sys\_2}} \right\rfloor + 1. \quad (8)$$

Thus, the last systematic bit at the output of stage 1 may be determined as a function of the last systematic bit at the output of the second stage of rate matching to be transmitted by this CE, the stage 2 rate matching state variable ($e_{ini,s\_2}$) and the stage 2 rate matching parameters $e_{minus,s\_2}$ and $e_{plus,s\_2}$, for the systematic bits.

Expression (9) shows that in the case of repetition:

$$N_{sys\_e} = \left\lceil \frac{(N_{t,sys\_e} - 1)e_{plus,sys\_2} + e_{ini,sys\_2}}{e_{plus,sys\_2} + e_{minus,sys\_2}} \right\rceil. \qquad (9)$$

The first stage of rate matching is always transparent for the systematic bits. Therefore, it is possible to extract the systematic bits between $N_{sys\_s}$ and $N_{sys\_e}$ at the output of the first stage of rate matching, and perform the second stage of rate matching on these bits only. Expressions 4-9 thus determine which systematic bits, out of the total set of systematic bits generated by the Turbo encoder, that will be processed and eventually transmitted by this channel element. These expressions also show how to determine $e_{ini}$ for the first bit to be processed by this channel element, which is needed for the rate matching algorithm.

Determining the Parity Bits that are to be Subject to the HARQ Functionality

The determination of which parity one and parity two bits are to be subject to the HARQ functionality can be done independently, e.g., in parallel, with the systematic bit determination. As given by the standard, the parity bits (the parity one and parity two bits are combined (multiplexed) at the output of the second stage of rate matching, and after bit collection are $P_1, P_2, \ldots, P_{N_{tp1}+N_{tp2}}$. For this description, $P_{N_{tp}\_s}$ denotes the first parity bit in column $N_{col,s}$, and $P_{N_{tp}\_e}$ is the last parity bit in column $N_{col,e}$.

$N_{t,p\_s}$, which represents the first parity bit after bit collection to be processed by the given CE, is given by expression (10):

$$N_{t,p\_s} = \begin{cases} (N_{row} - N_r - 1)(N_{col,s} - 1) + 1 & N_c \geq N_{col,s} \\ (N_{row} - N_r - 1)N_c + (N_{row} - N_r)(N_{col,s} - N_c - 1) + 1 & \text{otherwise} \end{cases} \qquad (10)$$

In expression (10), and as discussed above, $N_{row}$ is the number of rows in the bit collection array, which is 2 for QPSK and 4 for 16-QAM.

$N_{t,p\_e}$, which represents the last parity bit to be processed by this CE, may be given by expression (11):

$$N_{t,p\_s} = \begin{cases} (N_{row} - N_r - 1)N_{col,e} & N_c \geq N_{col,e} \\ (N_{row} - N_r - 1)N_c + (N_{row} - N_r)(N_{col,e} - N_c) & \text{otherwise} \end{cases} \qquad (11)$$

If $N_{t,p\_s}$ is larger than $N_{t,p\_e}$ no parity bits are transmitted by this CE, since the difference between $N_{t,p\_s}$ and $N_{t,p\_e}$ represents the total number of bits to be processed by this CE. If this number is negative, no bits are processed by this CE. In other words, this bit comparison (e.g., the number of the first and last parity bit to be processed by this CE) after bit collection may serve as an initial threshold determination as to whether or not any parity bits are to be HARQ encoded, or discarded.

Selection of the Parity One Bits to be HARQ Encoded

Assume that the parity one bits at the output of second stage of rate matching are $PO2_1, PO2_2, \ldots, PO2_{N_{tp1}}$. The first parity one bit that is used between columns $N_{col,s}$ and $N_{col,e}$ is $PO2_{N_{tp1}\_s}$. Thus, the number of parity one start bit at the output of second stage of rate matching may be given by expression (12):

$$N_{t,p1\_s} = \left\lceil \frac{N_{t,p\_s}}{2} \right\rceil \qquad (12)$$

In other words, expression (12) illustrates how to select the parity one start bit at the output of stage 2 rate matching, which is determined as a function of the number of the first parity bit after bit collection, divided by 2. This may be explained by the fact that half of the bits are parity one and half are parity two and that the first parity bit inserted in the bit collection matrix is a parity two bit.

The last parity one bit that is processed by this CE is $PO2_{N_{tp1}\_e}$. Thus, the last or ending parity one bit at the output of second stage of rate matching may be given by expression (13):

$$N_{t,p1\_e} = \left\lfloor \frac{N_{t,p\_e}}{2} \right\rfloor \qquad (13)$$

In other words, expression (13) illustrates how to select the last parity one bit at the output of stage 2 rate matching. This may be explained by the fact that half of the bits are parity one and half are parity two and that the first parity bit inserted in the bit collection matrix is a parity two bit.

Assume that the parity one bits at the output of first stage of rate matching are denoted by $PO1_1, PO1_2, \ldots, PO1_{N_{p1}}$, and that $PO1_{N_{p1}\_s}$ is the parity one bit at the output of the first stage of rate matching that gives parity one bit $PO2_{N_{tp1}\_s}$ at the output of the second stage of rate matching. It can be shown that in the case of puncturing, the first parity one bit at the output of the first stage of rate-matching, $N_{p1\_s}$, can be given by expression (14):

$$N_{p1\_s} = \left\lfloor \frac{N_{t,p1\_s} \cdot e_{plus,p1\_2} - e_{ini,p1\_2}}{e_{plus,p1\_2} - e_{minus,p1\_2}} \right\rfloor + 1. \qquad (14)$$

Thus, $N_{p1\_s}$ can be determined as a function of the stage 2 rate matching parameters for the parity one bits and the first parity one start bit at the output of the second stage of rate matching from expression (12). Also, the value of the rate matching state variable $e_{ini}$ at $N_{p1\_s}$ may be given by expression (15). The value of $e_{ini}$ may differ from CE to CE, as it depends on $N_{p1\_s}$.

$$e_{ini}(N_{p1\_s}) = e_{ini,p1\_2} - (N_{t,p1\_s} - 1)e_{plus,p1\_2} + (N_{p1\_s} - 1)(e_{plus,p1\_2} - e_{minus,p1\_2}). \qquad (15)$$

The In the case of repetition, $N_{p1\_s}$ may be given by expression (16):

$$N_{p1\_s} = \left\lceil \frac{(N_{t,p1\_s} - 1)e_{plus,p1\_2} + e_{ini,p1\_2}}{e_{plus,p1\_2} + e_{minus,p1\_2}} \right\rceil. \qquad (16)$$

And the value of the rate matching state variable at $N_{p1\_s}$ in case of repetition may be given by expression (17):

$$e_{ini}(N_{p1\_s}) = e_{ini,p1\_2} + (N_{t,p1\_s} - 1)e_{plus,p1\_2} - (N_{p1\_s} - 1)(e_{plus,p1\_2} + e_{minus,p1\_2}). \quad (17)$$

Assume that $PO1_{N_{p1}\_e}$ is the parity one bit at the output of the first stage of rate matching that gives parity one bit $PO2_{N_{t,p1}\_e}$ at the output of the second stage of rate matching. It can be shown that, in the case of puncturing, the parity one end bit at the output of the first stage of rate-matching, $N_{p1\_e}$, can be given by expression (18):

$$N_{p1\_e} = \left\lfloor \frac{N_{t,p1\_e} \cdot e_{plus,p1\_2} - e_{ini,p1\_2}}{e_{plus,p1\_2} - e_{minus,p1\_2}} \right\rfloor + 1. \quad (18)$$

Thus, for puncturing, $N_{p1\_e}$ can be determined as a function of the rate matching parameters for the parity one bits for the second stage of rate matching and the last parity one bit at the output of stage 2 rate matching determined from expression (13). In the case of repetition, $N_{p1\_e}$ may be given by expression (19):

$$N_{p1\_e} = \left\lceil \frac{(N_{t,p1\_e} - 1)e_{plus,p1\_2} + e_{ini,p1\_2}}{e_{plus,p1\_2} + e_{minus,p1\_2}} \right\rceil. \quad (19)$$

Assume that the parity one bits at the input of first stage of rate matching are $PO0_1, PO0_2, \ldots, PO0_{N_{in,p1}}$, where $PO0_{N_{in,p1}\_s}$ is the one parity bit at the input of the first stage of rate matching that gives parity one bit $PO1_{N_{p1}\_s}$ at the output of the first stage of rate matching. Accordingly, the parity one start bit at the input of the first stage of rate matching (e.g., those parity one start bit that will actually be selected (all others discarded) for input to the HARQ block of FIG. 2) (the first bit to be processed by this CE), or $N_{in,p1\_s}$, may be determined as given by expression (20).

$$N_{in,p1\_s} = \left\lfloor \frac{N_{p1\_s} \cdot e_{plus,p1\_1} - e_{ini,p1\_1}}{e_{plus,p1\_1} - e_{minus,p1\_1}} \right\rfloor + 1. \quad (20)$$

Also, the value of the rate matching state variable at $N_{in\,p1\_s}$ is given by expression (21):

$$e_{ini}(N_{in,p1\_s}) = e_{ini,p1\_1} - (N_{p1\_s} - 1)e_{plus,p1\_1} + (N_{in,p1\_s} - 1)(e_{plus,p1\_1} - e_{minus,p1\_1}) \quad (21)$$

There is no repetition in the first stage of rate matching in the 3GPP standard.

Assume that $PO0_{N_{in,p1}\_e}$ is the parity one bit at the input of the first stage of rate matching that gives parity one bit $PO1_{N_{p1}\_e}$ at the output of the first stage of rate matching. The last parity one bits at the input of the first stage of rate-matching (e.g., those last parity one bits that will actually be selected (all others discarded) for input to the HARQ block of FIG. 2), $N_{in,p1\_e}$, can be given by expression (22):

$$N_{in,p1\_e} = \left\lfloor \frac{N_{p1\_e} \cdot e_{plus,p1\_1} - e_{ini,p1\_1}}{e_{plus,p1\_1} - e_{minus,p1\_1}} \right\rfloor + 1. \quad (22)$$

As discussed above, there is no repetition in the first stage of rate matching.

Expressions 12-22 thus illustrate how to determine which parity one bits at the input of the HARQ block will be selected to fill the parity one bit positions between columns $N_{col,s}$ to $N_{col,e}$ in the bit collection matrix. It is these parity one bits, together with any selected systematic bits as described above, and any selected parity two bits, as will be described hereafter, which will be transmitted using channelization codes $ch_s$ to $ch_e$ (e.g., the 16-QAM or QPSK codes).

For example, and as shown above, selection of those parity one bits that are to be subject to the HARQ functionality may be as summarized below. A first determination is made as to whether any parity bits at all are to be selected for transmission by the CE (threshold determination, expressions (10) and (11)). Secondly, determination of the first and last parity one bits at the output of the second stage of rate matching may be done as a function of the determined first and last parity bits after bit collection (expressions (12) and (13)).

Thirdly, the first and last parity one bits at the output of the first stage of rate matching may be determined as a function of the corresponding rate matching parameters for the parity bits in the second stage of rate matching, and the determined first and last one bits at the output of the second stage of rate matching (expressions (14) through (19)). Finally, the parity one bits to be selected for input into the HARQ block for channel coding (e.g., those parity one bits which will fill columns $N_{col,s}$ to $N_{col,e}$ in the bit collection matrix) may be determined as a function of the determined first and last parity one bits at the output of the first stage of rate matching and the corresponding rate matching stage 1 rate matching parameters for the parity one bits (expressions (20) through (22)).

Therefore, each given CE may pre-encode an entire HS-DSCH transport block but post-encode (e.g., by implementing the HARQ functionality) only the selected bits. Thus, only the selected bits (systematic, parity one, parity two bits) are channel coded (HARQ encoded) for eventual transmission using the 16-QAM (or QPSK) channelization codes from the given CE to one or more users. Such a channel coding methodology may eliminate the requirement of a high-speed serial bus, and may enable reduced latency as compared to conventional channel coding methodologies.

Selection of the Parity Two Bits to be HARQ Encoded

As the expressions and determinations for selecting which parity two bits are to be subject to channel coding in the HARQ block are virtually the same as that described in detail above for the parity one bits, the relevant expressions are provided below for sake of convenience and consistency, it being understood that such determinations for parity two bits will only be performed if $N_{t,p\_s}$ is less than or equal to $N_{t,p\_e}$ as determined in expressions (10) and (11). Assuming that is the case, then each given CE will perform the following determinations to select those parity two bits which will be HARQ encoded, as detailed in expressions (23)-(33) below.

The parity two bits at the output of second stage of rate matching may be represented as $PT2_1, PT2_2, \ldots, PT2_{N_{t,p2}}$. The first parity two bit that is used between columns $N_{col,s}$ and $N_{col,e}$ is $PT2_{N_{t,p2}\_s}$. The number of the parity two bit at the output of second stage of rate matching may be given by expression (23):

$$N_{t,p2\_s} = \left\lfloor \frac{N_{t,p\_s}}{2} \right\rfloor + 1. \quad (23)$$

The last (or end) parity two bit that is used between columns $N_{col,s}$ and $N_{col,e}$ is $PT2_{N_{t,p2}\_e}$. The number of the last parity two bit at the output of second stage of rate matching may be given by expression (24):

$$N_{t,p2\_e} = \left\lceil \frac{N_{t,p\_e}}{2} \right\rceil. \qquad (24)$$

The parity two bits at the output of first stage of rate matching may be represented as $PT1_1, PT1_2, \ldots, PT1_{N_{p2}}$. The bit $PT1_{N_{p2}\_s}$ is the first parity two bit at the output of the first stage of rate matching that gives the first parity two bit $PT2_{N_{t,p2}\_s}$ at the output of the second stage of rate matching. In the case of puncturing, the number of the first parity two bit at the output of first stage of rate matching may be given by expression (25):

$$N_{p2\_s} = \left\lfloor \frac{N_{t,p\_s} \cdot e_{plus,p2\_2} - e_{ini,p2\_2}}{e_{plus,p2\_2} - e_{minus,p2\_2}} \right\rfloor + 1. \qquad (25)$$

Also, the value of the rate matching state variable, $e_{ini}$ at $N_{p2\_s}$ may be given by expression (26):

$$e_{ini}(N_{p2\_s}) = e_{ini,p2\_2} - (N_{t,p2\_s} - 1)e_{plus,p2\_2} + (N_{p2\_s} - 1)(e_{plus,p2\_2} - e_{minus,p2\_2}). \qquad (26)$$

In the case of repetition, $N_{p2\_s}$ may be determined by expression (27):

$$N_{p2\_s} = \left\lceil \frac{(N_{t,p2\_s} - 1)e_{plus,p2\_2} + e_{ini,p2\_2}}{e_{plus,p2\_2} + e_{minus,p2\_2}} \right\rceil. \qquad (27)$$

And, the value of the rate matching state variable at $N_{p2\_s}$ in case of repetition is shown by expression (28):

$$e_{ini}(N_{p2\_s}) = e_{ini,p2\_2} + (N_{t,p2\_s} - 1)e_{plus,p2\_2} - (N_{p2\_s} - 1)(e_{plus,p2\_2} + e_{minus,p2\_2}) \qquad (28)$$

The bit $PT1_{N_{p2}\_e}$ is the last parity two bit at the output of the first stage of rate matching that gives the last parity two bit $PT2_{N_{t,p2}\_e}$ at the output of the second stage of rate matching. In the case of puncturing, the number of the last parity two bit at the output of first stage of rate matching, $N_{p2\_e}$, may thus be given by expression (29):

$$N_{p2\_e} = \left\lfloor \frac{N_{t,p2\_e} \cdot e_{plus,p2\_2} - e_{ini,p2\_2}}{e_{plus,p2\_2} - e_{minus,p2\_2}} \right\rfloor + 1. \qquad (29)$$

In the case of repetition, $N_{p2\_e}$ may be given by expression (30):

$$N_{p2\_e} = \left\lceil \frac{(N_{t,p2\_e} - 1)e_{plus,p2\_2} + e_{ini,p2\_2}}{e_{plus,p2\_2} + e_{minus,p2\_2}} \right\rceil. \qquad (30)$$

Accordingly, and similar to the determination of parity one bits, the first and last parity bits at the output of the second stage of rate matching may be calculated as a function of the first and last parity bits after bit collection (expressions (23) and (24)). The first and last parity two bits at the output of the first stage of rate matching may thus be determined as a function of the corresponding rate matching parameters for the parity two bits in the second stage of rate matching, and the determined first and last parity two bits at the output of the second stage of rate matching (expressions (25) through (30)). Therefore, the final parity two bit calculation is to select those first and last parity two bits that will be input into the HARQ block for channel coding (e.g., those parity two bits which will fill the remaining columns $N_{col,s}$ to $N_{col,e}$ in the bit collection matrix not filled by the selected systematic and/or parity one bits).

The parity two bits at the input of first stage of rate matching may be represented as $PT0_1, PT0_2, \ldots, PT0_{N_{inp2}}$, where $PT0_{N_{in,p2}\_s}$ is the parity two bit at the input of the first stage of rate matching that gives parity two bit $PT1_{N_{p2}\_s}$ at the output of the first stage of rate matching. Accordingly, the first parity two bits at the input of the first stage of rate matching (e.g., those parity two start bits that will actually be selected (all others ignored) for input to the HARQ block of FIG. 2) may be determined as given by expression (31).

$$N_{in,p2\_s} = \left\lfloor \frac{N_{p2\_s} \cdot e_{plus,p2\_1} - e_{ini,p2\_1}}{e_{plus,p2\_1} - e_{minus,p2\_1}} \right\rfloor + 1. \qquad (31)$$

The value of the rate matching state variable at $N_{in,p2\_s}$ may be given by expression (32):

$$e_{ini}(N_{in,p2\_s}) = e_{ini,p2\_1} - (N_{p2\_s} - 1)e_{plus,p2\_1} + (N_{in,p2\_s} - 1)(e_{plus,p2\_1} - e_{minus,p2\_1}) \qquad (32)$$

As discussed previously, there is no repetition in the first stage of rate matching.

The parameter $PT0_{N_{in,p2}\_e}$ is the last parity two bit at the input of the first stage of rate matching that gives the last parity two bit $PT1_{N_{p2}\_e}$ at the output of the first stage of rate matching. The last parity two end bit at the input of the first stage of rate-matching (e.g., the last parity two bit that will actually be selected (all others ignored) for input to the HARQ block of FIG. 2), $N_{in,p2}\_e$, can be given by expression (33):

$$N_{in,p2\_e} = \left\lfloor \frac{N_{p2\_e} \cdot e_{plus,p2\_1} - e_{ini,p2\_1}}{e_{plus,p2\_1} - e_{minus,p2\_1}} \right\rfloor + 1. \qquad (33)$$

There is no repetition in the first stage of rate matching.

Accordingly, the above expressions illustrate how to determine which systematic bits, parity one bits and parity two bits at the input of the HARQ block will fill columns $N_{col,s}$ to $N_{col,e}$ in the bit collection matrix. It is these bits that will be transmitted using channelization codes $ch_s$ to $ch_e$ (e.g., 16-QAM (or QPSK) codes). It is only these bits that will be required to pass through HARQ block of FIG. 2. The remaining bits from the Turbo encoder are ignored by the HARQ functionality.

Channel coding of bits in a HS-DSCH transport block having been described, rate-matching principles may also be employed to determine which bits of the Turbo encoded transport block should be passed to the HARQ functionality and not punctured.

Figure 3:
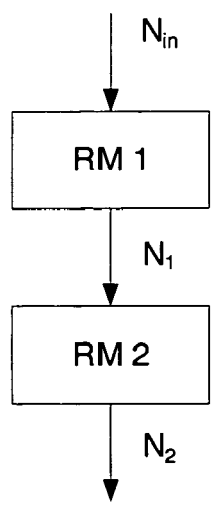
FIG. 3 is a block diagram representing a two-stage rate-matching algorithm, in accordance with an example embodiment of the present invention.

FIG. 3 is a block diagram representing a two-stage rate-matching algorithm. FIG. 3 may be referenced hereafter for illustrating a method of determining which bits of an HS-DSCH transport block to pass through the HARQ block and not to puncture, in accordance with an example embodiment of the present invention.

This example method may be applicable to system employing HSDPA where the puncturing rate is approaching or close to 1 (e.g., a high puncturing rate environment). A purpose of this example methodology may be to save MIPS (or DSP cycle time in a DSP implementation) in a high puncturing rate environment where most of the separated bits at the output of the bit separator in the HARQ block will be punctured (e.g., discarded by the HARQ functionality); substantially few of the systematic parity one and/or parity two bits will be passed to the first and second rate-matching stages.

In an example, and given a HSPDA channel in a relatively ideal environment, the systematic bits would be passed to the rate-matching stages and most if not all of the parity bits would be punctured. This causes the coding rate to approach 1, which may translate into improved efficiency, less redundant information and overall increased throughput through the system. However, even a less than ideal channel environment could have a high puncturing rate, e.g., where data is repeated over multiple retransmissions. Accordingly, the example methodology may be applicable to any communication system and/or channel environment that may be subject to a high puncturing rate.

Puncturing Algorithm as Puncturing Rate Approaches One

FIG. 3 illustrates a simple two-stage rate-matching algorithm. The ratio between the number of bits at the input/output of each rate matching stage may be given by expression (34):

$$N_{in}:N_1:N_2 = X_1 \cdot Y_1 : X_2 \cdot Y_2 : 1 \quad (34)$$

In expression (34), $X_1$ and $X_2$ represent integer values of bits, and $Y_1$ and $Y_2$ are fractional values of bits. Thus expression (34) illustrates that for every 1 bit at the output of stage 2 rate matching, there will be $X_1 \cdot Y_1$ bits at the input to the first rate matching stage (stage 1), and $X_2 \cdot Y_2$ bits at the input to stage 2/output of stage 1 rate matching. The rate matching parameters for the first stage of rate matching may be denoted as $e_{ini\_1}$, $e_{minus\_1}$ and $e_{plus\_1}$. The rate matching parameters for the second stage of rate matching may be denoted as $e_{ini\_2}$, $e_{minus\_2}$ and $e_{plus\_2}$.

Accordingly, the following sets of expressions (35) to (40) may be defined for bits $X_2$ and bits $Z_2$, $X_A$, $Z_A$, $X_B$, and $Z_B$. The parameter $X_2$ may denote the floor or lower boundary of the $X_2 \cdot Y_2$ bits at the input to stage 2/output of stage 1 rate matching ($X_2$=floor($X_2 \cdot Y_2$)), and $Z_2$ may represent the ceiling or upper boundary of the $X_2 \cdot Y_2$ bits at the input to stage 2/output of stage 1 rate matching ($Z_2$=ceiling($X_2 \cdot Y_2$)). Additionally using this notation, $X_A$=floor($X_2 * X_3 \cdot Y_3$), e.g., lower boundary of $X_2$ times the $X_3 \cdot Y_3$ bits at the input to stage 1 rate matching, $Z_A$=ceil($X_2 * X_3 \cdot Y_3$), $X_B$=floor($Z_2 * X_3 \cdot Y_3$) and $Z_B$=ceiling($Z_2 * X_3 \cdot Y_3$). Let $X_3 \cdot Y_3$ be the ratio between $N_{in}$ and $N_1$ (described in paragraph 81), i.e., $X_3 \cdot Y_3$ bits at the input of stage 1 generate one bit at the output of stage 1.

$$\text{Define: } X_2 = \left\lfloor \frac{e_{plus\_2}}{e_{plus\_2} - e_{minus\_2}} \right\rfloor \quad (35)$$

$$Z_2 = \left\lceil \frac{e_{plus\_2}}{e_{plus\_2} - e_{minus\_2}} \right\rceil \quad (36)$$

Where, $X_2 = Z_2$ if $\frac{e_{plus\_2}}{e_{plus\_2} - e_{minus\_2}}$ is an integer $X_2 + 1 = Z_2$ otherwise -continued $$\text{Define: } X_A = \left\lfloor X_2 \frac{e_{plus\_1}}{e_{plus\_1} - e_{minus\_1}} \right\rfloor \quad (37)$$

$$Z_A = \left\lceil X_2 \frac{e_{plus\_1}}{e_{plus\_1} - e_{minus\_1}} \right\rceil \quad (38)$$

Where $X_A = Z_A$ if $X_2 \frac{e_{plus\_1}}{e_{plus\_1} - e_{minus\_1}}$ is an integer $X_A + 1 = Z_A$ otherwise $$\text{Define: } X_B = \left\lfloor \frac{e_{plus\_1}}{e_{plus\_1} - e_{minus\_1}} \right\rfloor \quad (39)$$

$$Z_B = \left\lceil Z_2 \frac{e_{plus\_1}}{e_{plus\_1} - e_{minus\_1}} \right\rceil \quad (40)$$

Where $X_B = Z_B$ if $Z_2 \frac{e_{plus\_1}}{e_{plus\_1} - e_{minus\_1}}$ is an integer $X_B + 1 = Z_B$ otherwise In a case where $X_1$ and $X_2$ are much larger than one, a more efficient implementation of the rate matching algorithm may be to operate on the output bits instead of the input bits since they are fewer in number. In an example, a $k^{th}$ input bit $A_k$ generates an $m^{th}$ bit $B_m$ at the output of the first stage of rate matching, which generates an $n^{th}$ bit $C_n$ at the output of the second stage of rate matching. Therefore, the $(n+1)^{th}$ bit at the output of the second stage of rate matching is the $(m+X_2)$ or $(m+Z_2)$ bit at the output of stage one, which corresponds to $(k+X_A)$, $(k+Z_A)$, $(k+X_B)$ or $(k+Z_B)$ at the input of stage one.

In other words, to select the next output bit, skip $X_2-1$ or $Z_2-1$ bits at the output of stage 1 (input of stage 2). If we skipped $X_2-1$ bits at the output of stage 2 (these bits are punctured and/or discarded), we skip $X_A-1$ or $Z_A-1$ bits at the input of stage 1. Alternatively, if we skipped $Z_2-1$ bits at the output of stage 1, we skip $X_B-1$ or $Z_B-1$ bits at the input to stage 1.

Table 2 lists definition for the following rate matching state variables that are used in the rate matching stages. The rate matching state variable e is updated each time an input bit is processed as described in TS 25.212 ($e_{minus\_}$ is subtracted). As the state variable is updated if its value becomes negative, a bit is punctured and the value is made positive by adding $e_{plus\_}$.

TABLE 2

| Rate matching state variable definitions | |
|---|---|
| $e_2(n)$: | the rate matching state variable of the second stage rate matching function after the input bit corresponding to output bit n has been processed. |
| $e_2(n + 1)$: | the rate matching state variable of the second stage rate matching function after the input bit corresponding to output bit (n + 1) has been processed. |
| $e_1(n)$: | the rate matching state variable of the first stage rate matching function after the input bit corresponding to output bit n has been processed. |
| $e_1(n + 1)$: | the rate matching state variable of the first stage rate matching function after the input bit corresponding to output bit (n + 1) has been processed. |

The updating of the stage 1 and stage 2 rate matching state variables $e_1(n)$ and $e_2(n)$, and the selection of the input bit that corresponds to the (n+1) output bit may be performed as indicated in the following algorithm, which illustrates how bits are to be selected so as to be passed through the HARQ block and not to be punctured. In general, each rate matching stage has a state variable associated with it. If the state variable satisfies a certain condition or goes negative, the output bit is punctured. Generally, the algorithm looks at the output bits from the second rate-matching stage and determines if the output bits are consistent with the input bits to be input into the first stage of rate matching. For those output bits that satisfy certain determinations in the algorithm, the next bit that is to cause an output of the bit from stage 2 that satisfies the criteria is to be passed through at the input of stage 1 and not punctured.

Accordingly, for stage 2 rate matching, the algorithm processes $X_2$ bits and if the state variable $e_2(n)$ is non-positive, an "addition bit" is processed. For stage 1 rate matching, the number of bits processed is $X_A$ or $X_B$ (depending on the number of bits processed in stage 2). If the state variable $e_1(n)$ is negative an "addition bit" is processed.

Figure 4:
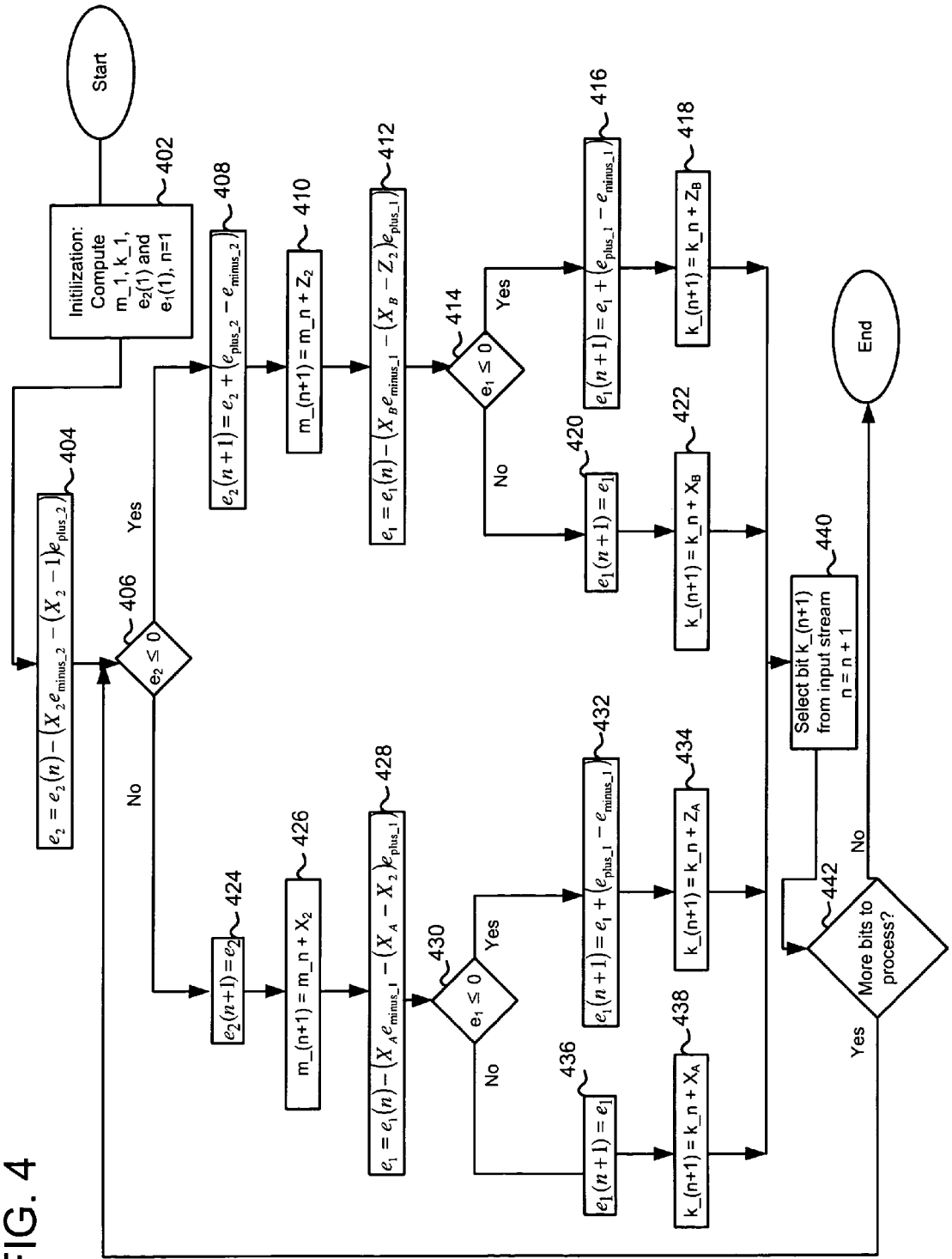
FIG. 4 is a process flow diagram illustrating a method of determining which bits of a received transport block to pass and not to puncture based on a HARQ functionality implemented to channel code bits for transmission by a channel element to a given user, in accordance with an example embodiment of the present invention.

FIG. 4 is a process flow diagram illustrating a method of determining which bits of a received transport block to pass and not to puncture based on a HARQ functionality implemented to channel code bits for transmission by a channel element to a given user, in accordance with an example embodiment of the present invention. Frequent reference may be made to FIG. 4 for the discussion of the following algorithm.

For the following algorithm, "k" represents an index of the bit at the input to the first stage of rate matching, and "m" represents an index of the bit at the output of the first stage/input of second stage of rate matching, "n" represents an index of the bit output from the second stage of rate matching. The process steps in FIG. 4 have been matched to steps in the algorithm below for ease of understanding.

Let:

---

$e_2 = e_2(n)-(X_2 e_{minus\_2} - (X_2 - 1)e_{plus\_2})$ // $X_2$ bits are processed, $X_2-1$ of which are punctured (404)
If ($e_2 \leq 0$) (output of 406 is 'YES')
{
    $e_2(n + 1) = e_2 + (e_{plus\_2} - e_{minus\_2})$// an addition bit is processed in stage 2 rate matching (408)
    Select bit $(m + Z_2)$ at the input to stage 2. (410)
    $e_1 = e_1(n)-(X_B e_{minus\_1} - (X_B - Z_2)e_{plus\_1})$ // $X_B$ bits are processed in stage 1 rate matching, $X_B - Z_2$ of which are punctured. (412)
    If ($e_1 \leq 0$)(output of 414 is 'YES')
    {
        $e_1(n + 1) = e_1 + (e_{plus\_1} - e_{minus\_1})$ // an addition bit is processed in stage 1 rate matching (416)
        Select bit $(k + Z_B)$ at the input to stage 1. (418)
    }
    else $e_1(n + 1) = e_1$ (420)
        Select bit $(k + X_B)$ at the input to stage 1. (422)
}
else $e_2(n + 1) = e_2$ (output of 406 is 'NO', see 424)
{
    Select bit $(m + X_2)$ at the input to stage 2. (426)
    $e_1 = e_1(n)-(X_A e_{minus\_1} - (X_A - X_2)e_{plus\_1})$ $X_A$ bits are processed in stage 1 rate matching, $X_A - X_2$ of which are punctured (428).
    If ($e_1 \leq 0$) output of 430 is 'YES')
    {
        $e_1(n + 1) = e_1 + (e_{plus\_1} - e_{minus\_1})$ // an addition bit is processed in stage 1 rate matching (432)
        Select bit $(k + Z_A)$ at the input to stage 1. (434)
    }
    else $e_1(n + 1) = e_1$ (436)
        Select bit $(k + X_A)$ at the input to stage 1. (438)
}

---

Depending on which sub-criteria is satisfied in the algorithm above, as shown in FIG. 4, the next bit at the input to the first stage of rate matching (k (n+1)) is selected (440) from the next bit output from the second stage of rate matching n (n+1) and the algorithm repeats until there are no more bits to process (output of 442 is 'NO'). Assuming that at least $X_2$ bits are present to generate the next output of bits from stage 2, $X_2 \leq Z_2$. If this relation is correct, then the value of $e_2$ (the rate matching state variable for stage 2) should be a positive number. If $e_2$ is negative or zero, this means that $Z_2$ bits should have been processed by the second rate-matching stage.

Initialization

Initialization should be performed to determine the operation of rate matching at start-up. Assume that input bit $k_1$ (input to stage 1) generates bit $m_1$ at the output of the first stage of rate matching, which then generates the first output bit $n_1$ from the second stage of rate matching. Therefore, the first bit k that is to pass through the HARQ block may be determined from the following expressions:

$$m_1 = \left\lfloor \frac{e_{minus\_2} - e_{ini\_2}}{e_{plus\_2} - e_{minus\_2}} \right\rfloor + 2 \qquad (41)$$

and $$k_1 = \left\lfloor \frac{m_1 e_{minus\_1} - e_{ini\_1}}{e_{plus\_1} - e_{minus\_1}} \right\rfloor + m_1 + 1. \qquad (42)$$

In others words, $m_1$ is determined as a function of the rate matching parameters for the second stage of rate matching, and $k_1$ as a function of the rate matching parameters for the first stage of rate matching and $m_1$.

The rate matching state variable of the second stage after processing bit $m_1$ may be given by expression (43):

$$e_2(1) = e_{ini\_2} - m_1 e_{minus\_2} + (m_1 - 1)e_{plus\_2}. \qquad (43)$$

The rate matching state variable of the first stage after processing bit $k_1$ may be given by expression (44):

$$e_1(1) = e_{ini\_1} - k_1 e_{minus\_1} + (k_1 - m_1)e_{plus\_1}. \qquad (44)$$

In expressions (43) and (44), it can been seen that the values of $e_2(1)$ and $e_1(1)$ after the first bit n has been passed through and not punctured may be determined based on the rate matching parameters for the first and second stages of rate matching and the initial values calculated for $m_1$ and $k_1$.

Therefore, the example method of determining which bits of a received transport block to pass and not to puncture based on a HARQ functionality implemented to channel code bits for transmission by a channel element to one or more users may reduce computational complexity by processing the data based on the output bit rate and not the input bit rate. In this case the output bit rate may be substantially less than the input bit rate. Although this example method has been described with respect to a two stage rate-matching algorithm, this method may be extended to multi-stage rate matching implementations where there are greater than two rate matching stages (N>2).

The example embodiments of the present invention being thus described, it will be obvious that the same may be varied in many ways. Such variations are not to be regarded as departure from the spirit and scope of the example embodiments of the present invention, and all such modifications as would be obvious to one skilled in the art are intended to be included within the scope of the following claims.

What is claimed is:

1. A method of encoding data for transmission on a data channel to one or more users, comprising:

determining which bits, from a total set of systematic bits, parity one bits and parity two bits sent from an encoder are to be subject to a HARQ (hybrid-automatic request) functionality in a HARQ data block and transmitted employing a set of channelization codes by a particular channel element, said determination being performed employing an inverse transformation of the HARQ function to determine which bits at an input of the HARQ data block will be included in an output of the HARQ data block to be transmitted by a particular channel element, the determining step including, performing a first stage rate matching on the total set such that a range of the systematic bits may be determined from the output of the first stage rate matching, the first stage rate matching being one of two rate-matching stages; and channel coding the bits determined in the determining step in an HARQ data block using the two rate-matching stages and a virtual buffer, wherein the performing of the first rate matching includes, determining a first systematic bit at the output of the first stage of rate matching, $N_{sys\_s}$, to be processed by the HARQ data block for channel coding and eventual transmission, determining a last systematic bit at the output of the first stage of rate matching, $N_{sys\_e}$, to be processed by the HARQ data block for channel coding and eventual transmission, selecting a range of the systematic bits $N_{sys\_s}$ and $N_{sys\_e}$, and performing a second stage of rate matching on only the range of selected systematic bits.

2. The method of claim 1, wherein said determining includes selecting a given number of the systematic bits, parity one bits and parity two bits less than the total set for channel coding in the HARQ data block.

3. The method of claim 2, further comprising:

combining the systematic, parity one and parity two bits output from the second rate match stage by filling columns in a bit collection matrix, wherein bits in the bit collection matrix are transmitted using a given set of channelization codes.

4. The method of claim 3, wherein the given set of channelization codes include at least one of 16-QAM and QPSK codes.

5. The method of claim 1, wherein $N_{sys\_s}$ is determined based on a first systematic bit at the output of the second stage of rate matching to be transmitted, $N_{t,s\_s}$, and rate matching parameters for the systematic bits in the second stage of rate matching.

6. The method of claim 1, wherein $N_{sys\_e}$ is determined based on a last systematic bit at the output of the second stage of rate matching to be transmitted, $N_{sys\_e}$, and rate matching parameters for the systematic bits in second stage of rate matching.

7. The method of claim 6, wherein a rate matching state variable for the first bit that will be processed in the HARQ data block for transmission is determined as a function of a rate matching state variable for the second stage of rate-matching, $e_{ini,s\_2}$, and rate matching parameters for the systematic bits in the second stage of rate matching, ($e_{minus,s\_2}$ and $e_{plus,s\_2}$).

8. The method of claim 3, wherein determining which bits are to be subject to HARQ functionality in a HARQ data block for channel coding further includes:

performing an initial threshold determination as to whether or not systematic, parity one and parity two bits are to be processed by the HARQ data block for eventual transmission, wherein given parity one and parity two bits from the total set are to be selected if the threshold determination is satisfied, else only systematic bits are to be input, with all parity one and parity two bits punctured by the HARQ data block and not subject to channel coding.

9. The method of claim 8, wherein determining further includes selecting given parity one bits to be subject to channel coding for eventual transmission by:

determining first and last parity one bits at the output of the second stage of rate matching based on the parity bits combined after bit collection, determining first and last parity one bits at the output of the first stage of rate matching as a function of rate matching parameters for the parity bits in the second stage of rate matching and the determined first and last parity one bits at the output of the second stage of rate matching, selecting those parity one bits to be input into the HARQ data block for channel coding based on the determined first and last parity one bits at the output of the first stage of rate matching and rate matching parameters for the parity one bits in the first stage of rate matching.

10. The method of claim 8, wherein determining further includes selecting given parity two bits to be subject to channel coding for eventual transmission by:

determining first and last parity two bits at the output of the second stage of rate matching based on the parity bits combined after bit collection, determining first and last parity two bits at the output of the first stage of rate matching as a function of rate matching parameters for the parity two bits in the second stage of rate matching and the determined first and last parity one bits at the output of the second stage of rate matching, and selecting those parity one bits to be input into the HARQ data block for channel coding based on the determined first and last parity two bits at the output of the first stage of rate matching and rate matching parameters for the parity two bits in the first stage of rate matching.

11. A method of distributing channel coding for a data transport block received by a plurality of channel elements for transmission on a data channel to one or more users, comprising:

separating, at a channel element, the data transport block into systematic bits, parity one bits and parity two bits;

identifying, by the channel element, a given number of bits of data from a data transport block to be input to a hybrid-automatic request (HARQ) data block for channel coding, the given number of bits of data being less than the total number of bits in the data transport block, the identifying step including, performing a first stage rate matching on the systematic bits, the parity one bits, and the parity two bits such that a range of the systematic bits may be determined from the output of the first stage rate matching, the first stage rate matching being one of two rate-matching stages; and channel coding the given number of input bits in the HARQ data block to obtain the bits to be transmitted by the channel element to one or more users, the channel coding including a rate matching process, the given number of bits including only systematic bits if a first parity bit assigned to the channel element is greater than a last parity bit assigned to the channel, wherein the performing of the first rate matching includes,
  determining a first systematic bit at the output of the first stage of rate matching, $N_{sys\_s}$, to be processed by the HARQ data block for channel coding and eventual transmission,
  determining a last systematic bit at the output of the first stage of rate matching, $N_{sys\_e}$, to be processed by the HARQ data block for channel coding and eventual transmission,
  selecting a range of the systematic bits $N_{sys\_s}$ and $Ns_{sys\_e}$, and
  performing a second stage of rate matching on only the range of selected systematic bits.

12. A method of encoding data for transmission on a data channel to one or more users, the method comprising:
  separating a data transport block received by the channel element into a total set of systematic bits, parity one bits and parity two bits;
  identifying, by the channel element, a given number of bits of data from the data transport block to be input to a hybrid-automatic request (HARQ) data block for channel coding, the given number of bits of data being less than the total number of bits in the data transport block, the identifying step including,
    performing a first stage rate matching on the total set such that a range of the systematic bits may be determined from the output of the first stage rate matching, the first stage rate matching being one of two rate-matching stages; and
  channel coding the given number of input bits in the HARQ data block to obtain the bits to be transmitted by the channel element to one or more users, the channel coding including a rate matching process, the given number of bits including only systematic bits if a first parity bit assigned to the channel element is greater than a last parity bit assigned to the channel; wherein
    only those identified bits are input to the HARQ data block for transmission using a given set of channelization codes to said one or more users, and
    the performing of the first rate matching includes,
      determining a first systematic bit at the output of the first stage of rate matching, $N_{sys\_s}$, to be processed by the HARQ data block for channel coding and eventual transmission,
      determining a last systematic bit at the output of the first stage of rate matching, $N_{sys\_e}$, to be processed by the HARQ data block for channel coding and eventual transmission,
      selecting a range of the systematic bits $N_{sys\_s}$ and $N_{sys\_e}$, and
      performing a second stage of rate matching on only the range of selected systematic bits.

13. A method of encoding data for transmission on a data channel to one or more users, the method comprising:
  identifying, by a channel element, a given number of bits of data from a data transport block to be input to a hybrid-automatic request (HARQ) data block for channel coding, the given number of bits of data being less than the total number of bits in the data transport block, wherein the channel coding includes a rate matching process and the rate matching process includes a first rate matching stage and a second rate matching stage, the identifying step including,
    performing the first stage rate matching on the total set such that a range of the systematic bits may be determined from the output of the first stage rate matching;
    determining bits that are to be input, and not punctured, to the first rate matching stage based on a set of bits that are to be output of the second rate matching stage; and
  channel coding the given number of input bits in the HARQ data block to obtain the bits to be transmitted by the channel element to one or more users, the given number of bits including only systematic bits if a first parity bit assigned to the channel element is greater than a last parity bit assigned to the channel, wherein the performing of the first rate matching includes,
    determining a first systematic bit at the output of the first stage of rate matching, $N_{sys\_s}$, to be processed by the HARQ data block for channel coding and eventual transmission,
    determining a last systematic bit at the output of the first stage of rate matching, $N_{sys\_e}$, to be processed by the HARQ data block for channel coding and eventual transmission,
    selecting a range of the systematic bits $N_{sys\_s}$ and $N_{sys\_e}$, and
    performing the second stage of rate matching on only the range of selected systematic bits.

14. The method of claim 13, wherein the channel element has a puncturing rate approaching one, in which a majority of the bits are punctured.

15. The method of claim 13, wherein determining includes determining bits that are to be passed, and not punctured, to the first rate matching stage of a HARQ data block based on the output bits from the second rate-matching stage of the algorithm.

16. The method of claim 15, further comprising:
  passing a next bit to the first rate-matching stage that is to cause an output of the bit from the second stage to satisfy a given criterion based on a state variable for the second rate-matching stage.

17. The method of claim 15, wherein determining bits that are to passed to the first rate-matching stage further includes:
  defining a parameter $X_2$ which represents a lower boundary of $X_2 \cdot Y_2$ bits at the input to the second rate-matching stage, $X_2$ denoting an integer value of bits input to the second rate-matching stage and $Y_2$ a fractional value of bits input to the second rate-matching stage, ($X_2$=floor($X_2 \cdot Y_2$)),
  defining a parameter $Z_2$ representing an upper boundary of the $X_2 \cdot Y_2$ bits ($Z_2$=ceiling($X_2 \cdot Y_2$)),
  defining a parameter $X_A$ representing a lower boundary of $X_2$ times $X_3 \cdot Y_3$ bits at the input to first rate-matching stage, $X_A$=floor($X_2 * X_3 \cdot Y_3$),
  defining a parameter $Z_A$=ceiling ($X_2 * X_3 \cdot Y_3$),
  defining a parameter $X_B$=floor($Z_2 * X_3 \cdot Y_3$) and
  defining a parameter $Z_B$=ceiling($Z_2 * X_3 \cdot Y_3$).

18. The method of claim 17, wherein determining bits that are to passed to the first rate-matching stage further includes:
  calculating a rate-matching state variable $e_2$ for a given bit n output from the second rate matching stage based on $X_2$,
  wherein if at least $X_2$ bits are present to generate a next output of bits (n+1) from the second rate-matching stage, $X_2 \leq Z_2$, the value of $e_2$ is positive,
  else if $e_2$ is negative or zero, $Z_2$ bits are processed by the second rate-matching stage.

19. The method of claim 18, wherein determining bits that are to be passed to the first rate-matching stage of the HARQ data block further includes:
  where $e_2 \leq 0$,
    setting $e_2$ for the next output of bits (n+1) from the second rate-matching stage to $e_2+(e_{plus\_2}-e_{minus\_2})$, where $e_{plus\_2}$ and $e_{minus\_2}$ denote rate matching state parameters for the second rate-matching stage, incrementing m by $Z_2$, calculating $e_1$ based on $X_B$ and $Z_2$, wherein if $e_1 \leq 0$, calculating the bit k representing the bit to be passed and not punctured for the next output of bits from the second stage of rate matching, k (n+1) based on $Z_B$, else determining k (n+1) based on $X_B$.

20. The method of claim 19, wherein if $e_2>0$, determining bits that are to be passed to the first rate-matching stage of the HARQ data block further includes:

setting $e_2$ for the next output of bits, $e_2$ (n+1) to $e_2$, incrementing a bit m representing a bit at the output of the first rate matching stage by $X_2$, calculating a rate-matching state variable $e_1$ output from the first rate matching stage based on $X_A$ and $X_2$, wherein if $e_1 \leq 0$, calculating a bit k at the input to the first stage of rate matching and representing the bit to be passed and not punctured for the next output of bits from the second stage of rate matching, k (n+1) based on $Z_A$, else determining k (n+1) based on $X_A$.

21. A method of determining which bits of a received data transport block to pass to a rate-matching function and not to puncture, so as to channel code the bits for transmission by a channel element on a data channel, the method comprising:

determining bits that are to be input to a first rate-matching stage of an N-stage (N>2) rate matching function implemented in a HARQ data block of the channel element based on the output bits from a subsequent rate-matching stage, such that a range of systematic bits may be determined from the output of the first stage rate matching, wherein the performing of the first rate matching includes, determining a first systematic bit at the output of the first stage of rate matching, $N_{sys\_s}$, to be processed by the HARQ data block for channel coding and eventual transmission, determining a last systematic bit at the output of the first stage of rate matching, $N_{sys\_e}$, to be processed by the HARQ data block for channel coding and eventual transmission, selecting the range of the systematic bits $N_{sys\_s}$ and $N_{sys\_e}$, and performing a second stage of rate matching on only the range of selected systematic bits.

22. The method of claim 21, further comprising:

passing a next bit to the first rate-matching stage that is to cause an output of the bit from the subsequent rate-matching stage to satisfy a given criterion based on a state variable for the second or subsequent rate-matching stage.

23. The method of claim 21, wherein the channel element has a puncturing rate approaching one.

* * * * *